(12) United States Patent
Dias

(10) Patent No.: US 6,861,285 B2
(45) Date of Patent: Mar. 1, 2005

(54) FLIP CHIP UNDERFILL PROCESS

(75) Inventor: Rajen C. Dias, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/407,534

(22) Filed: Apr. 4, 2003

(65) Prior Publication Data

US 2003/0203536 A1 Oct. 30, 2003

Related U.S. Application Data

(62) Division of application No. 10/012,409, filed on Dec. 12, 2001.

(51) Int. Cl.$^7$ .............................................. H01L 21/44
(52) U.S. Cl. ...................... 438/108; 438/118; 438/613
(58) Field of Search ................................ 438/108, 118, 438/119, 455, 613

(56) References Cited

U.S. PATENT DOCUMENTS

| | | | | |
|---|---|---|---|---|
| 5,136,365 A | * | 8/1992 | Pennisi et al. ............... 257/783 |
| 6,121,689 A | * | 9/2000 | Capote et al. ............... 257/783 |
| 6,234,379 B1 | * | 5/2001 | Donges ....................... 228/207 |
| 6,316,286 B1 | * | 11/2001 | Trezza ......................... 438/107 |
| 6,335,571 B1 | * | 1/2002 | Capote et al. ............... 257/787 |
| 6,337,265 B1 | * | 1/2002 | Trezza et al. ................ 438/612 |
| 2001/0051392 A1 | * | 12/2001 | Akram ......................... 438/106 |
| 2002/0081772 A1 | * | 6/2002 | Madrid et al. .............. 438/108 |

* cited by examiner

Primary Examiner—T. N. Quach
(74) Attorney, Agent, or Firm—Blakely, Sokoloff, Taylor & Zafman LLP

(57) ABSTRACT

A die with flip chip bumps including at least one layer of filled underfill on the die surface and a layer of unfilled underfill over the filled underfill and the flip chip bumps. An IC assembly including a substrate with bumps and at least one layer of filled underfill on the substrate surface and a layer of unfilled underfill over the filled underfill and the bumps. A die or IC assembly with a plurality of filled underfill layers with differing CTE. Methods of making the dies and IC assemblies.

12 Claims, 4 Drawing Sheets

FLIP CHIP UNDERFILL PROCESS

This is a Divisional Application of Ser. No. 10/012,409 filed Dec. 12, 2001, which is presently pending.

BACKGROUND OF THE INVENTION

1. Field of the Invention

The invention relates to integrated circuit ("IC") packaging, in particular to dies and IC assemblies using underfill.

2. Related Art

Flip chips are surface-mounted chips having connecting metal lines attached to pads on the underside of the chips. A chip or die is typically mounted on an IC substrate to form an IC assembly. For example, a flip chip may be mounted on a package substrate and the resulting package mounted on a printed circuit board ("PCB"). A flip chip may also be directly mounted to a PCB.

Underfill is provided between the chip and the IC substrate to support the electrical connections, to protect them from the environment, and to reduce the thermomechanical stress on the flip chip connection. Underfill materials generally have different coefficients of thermal expansion ("CTE") from chip and substrate components, e.g., solder connections. This CTE mismatch can lead to thermomechanical stresses that can cause device failure. To avoid this problem, it is desirable for the underfill and other components to have similar CTEs. Underfill CTE may be adjusted by blending filler materials into the underfill. However, dispensing underfill involves long throughput time and acts as a bottleneck in the assembly process. If an underfill has high filler content, it may be difficult to distribute the underfill in a capillary or dispense flow process, especially when a small gap separates the chip and the substrate.

In conventional "no flow" underfill processes, underfill is applied to the surface of an IC substrate. To join a die to the substrate, the die's flip chip bumps are pushed through the underfill material until the flip chip bumps make contact with corresponding package substrate bumps. FIG. 1 shows a cross-section of a die and package in a conventional no flow underfill process. Flip chip die 110 contains a plurality of flip chip bumps on a surface 112, one of which is shown as bump 115. The die 110 is mated to package substrate 120, which contains substrate bump 130 on substrate bump pad 125. A layer of solder resist 140 and a layer of filled underfill 135 cover substrate 120. Die 110 is joined to substrate 120 by pressing flip chip bump 115 through underfill 135 until flip chip bump 115 makes contact with substrate bump 130. This process can also occur at the wafer level, where the wafer contains a plurality of dies 110 each having a plurality of flip chip bumps 115. Package substrate 120 would then be part of a panel or sheet containing many substrate pads 125 and bumps 130 configured to mate with the flip chip bumps 115 on the wafer.

Such a no flow process normally results in high open fails, because filler particles are trapped between the flip chip bumps 115 and the substrate bumps 130. Reducing or eliminating filler in the underfill used in the no flow underfill process is a poor solution to this problem, because doing so restores the problem of poor reliability of the resulting products due to CTE mismatch.

There is therefore a need for an improved process for applying underfill in making IC assemblies.

BRIEF DESCRIPTION OF THE DRAWINGS

Details of the invention can be found in the illustrative embodiments of the invention which are described below with reference to the drawings, in which.

DETAILED DESCRIPTION OF THE PREFERRED EMBODIMENTS

Figure 1:
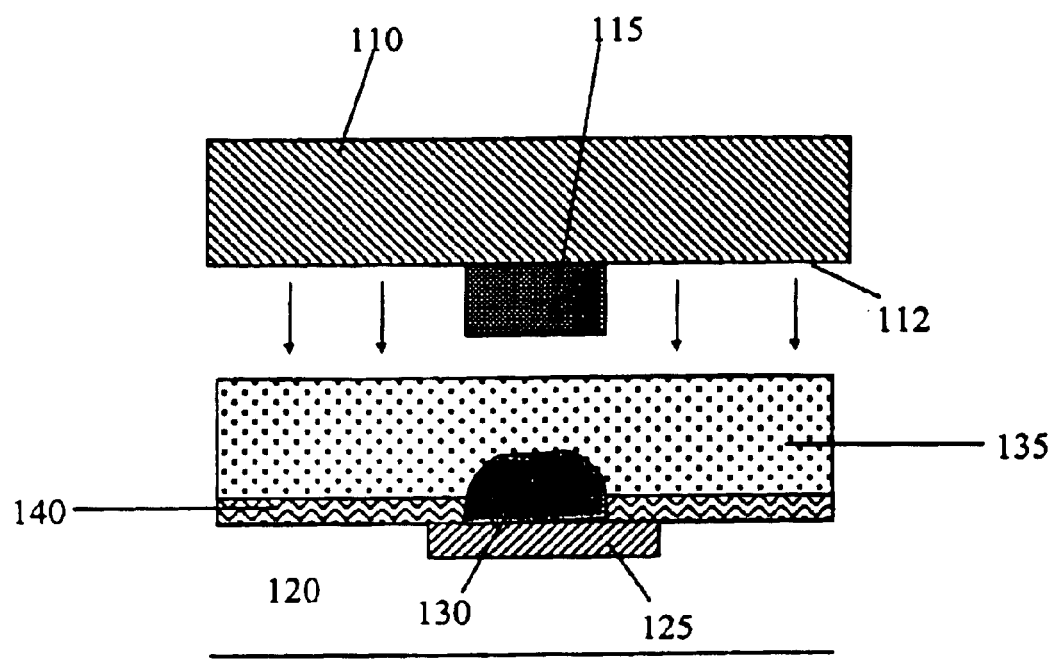
FIG. 1 shows a cross-section of a die and package substrate according to a conventional no flow underfill process.
Figure 2A:
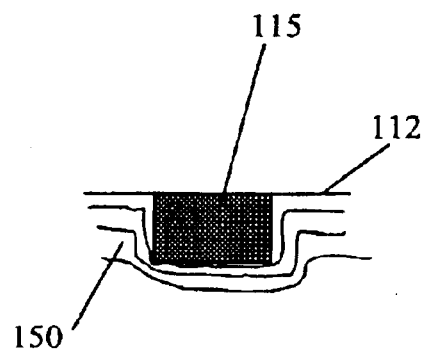
FIG. 2A shows a cross-section of a die with a flip chip bump after dispensing several underfill layers in an embodiment of the invention.
Figure 2B:
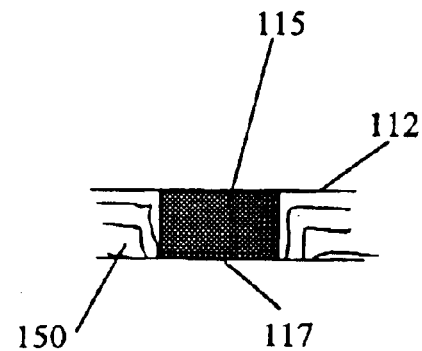
FIG. 2B shows the die of FIG. 2A after underfill has been removed from the bump surface.
Figure 2C:
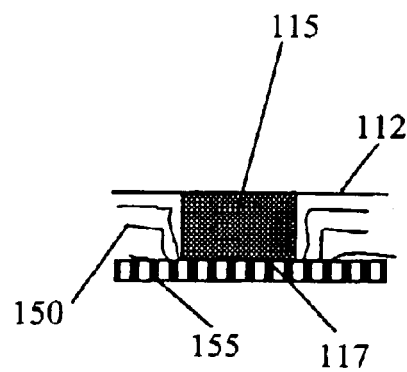
FIG. 2C shows the die of FIG. 2B with a final layer of unfilled underfill.

FIGS. 2A, 2B, and 2C show a sequence in an embodiment of the IC packaging process of the invention. FIG. 2A shows a cross-section of a flip chip bump 115 with layers of underfill 150 on bump 115 and die surface 112. Bump 115 represents one of a plurality of bumps on a die. The die may be one of a plurality of dies in a wafer. The inventions described herein apply to individual dies, i.e., to die-level processes, and to a collection of dies in a wafer, i.e., to wafer-level processes.

In general, a die will have a surface containing flip chip pads (not shown) and corresponding flip chip bumps 115. Flip chip bumps may be of any suitable conductive material, e.g., eutectic SnPb solders, high Pb solders, lead-free solders, Sn and Sn alloy solders, and metals such as Cu, Au, Ag, Ni, Sn, or suitable alloys thereof. Preferably, the flip chip bump is copper. Any conventional copper used for IC connections may be used, e.g., by the Damascene process. Preferably, the flip chip bump material will have a higher melting point than the package bump material. Prior to applying the underfill material, the die surface may be covered with an initial passivation layer and then a protective compliant layer, e.g., a thin. (ca. 3 $\mu$m) layer of polyimide.

Underfill layers 150 in FIG. 2 are applied as individual layers that cover both bump 115 and die surface 112.

Underfill is typically a polymeric material. Examples of underfill materials include epoxy resins (e.g., bisphenol A resins, bisphenol F resins, cycloaliphatic epoxy resins, and mixtures thereof), cyanate esters, siloxiranes, maleimides, polybenzoxazines, and polyimides. A number of layers of underfill with different mechanical properties can be applied to the die or package substrate. Examples of such mechanical properties include CTE, Young's modulus, and fracture toughness.

The underfill may contain hardeners (or crosslinking agents), catalysts, toughening agents, and fluxing agents. A typical underfill formulation will contain a polymer resin, a hardener, a curing catalyst, and a fluxing agent.

The underfill is preferably flux activated. The fluxing agent may be acidic or basic. Acidic fluxing agents may be organic acids, e.g., acrylic acid, heptanoic acid, lauric acid, palmitic acid, and valeric acid. The fluxing agent may also be neutral, e.g., an alcohol or polyol.

"Unfilled underfill" is underfill that is free or substantially free of filler material. Preferably, the unfilled underfill is flux activated.

"Filled underfill" is underfill that contains filler material. This allows for optimizing the CTE as needed. The filler may be a powered inorganic material, e.g., silica, alumina, carbon, or aluminum nitride, or mixtures thereof. The amount of filler used may vary widely depending on the particular underfill and filler combination. Preferably, the amount of filler will change the CTE of the underfill from about 3 ppm/° C. to 30 ppm/° C. Filled underfill may also be flux activated.

The underfill layers 150 are filled underfill, i.e., they contain filler.

Various processes may be used to apply underfill material to the wafer or package substrate. Examples of such processes include spin-on, dispense, coating (e.g., by brushing or spraying a liquid), and lamination (e.g., by applying a solid film or sheet).

A plurality of underfill layers may be applied by soft baking the previous layer prior to application of the next underfill material. "Soft baking" means to heat sufficiently to polymerize to a partially hardened state. The conditions for soft baking are optimized depending on the particular underfill material. Preferably, after successive soft baking steps the underfill may be further cured on joining the chip and substrate to allow for bonding to the substrate material.

The number and thickness of the underfill layers is not limited and can vary widely within the scope of the invention. Preferably, the number of underfill layers is from 2 to 10 layers, more preferably 3 to 4 layers. The thickness of each underfill layer is not limited and can be varied for specific applications as needed. Preferably, the underfill layers range in thickness from 5 µm to 30 µm, more preferably from 15 µm to 20 µm.

As shown in FIGS. 2A–C by the lines in underfill layers 150, the underfill layers may not form parallel planar regions in the local area surrounding bump 115, but may instead each show a contoured curvature rising towards the bump surface 117. This arises because of the shape that the underfill layers assume when applied to die surface 112 and the protruding bumps 115. For simplicity, this detail is not shown in FIGS. 3–4.

In one embodiment of the invention, at least one layer of filled underfill is applied and the underfill on the bumps is removed to expose the bumps. A final layer of unfilled underfill is then applied.

The underfill removal step preferably occurs only once after all filled underfill layers have been applied (see FIGS. 2A and 2B). Alternatively, underfill may be removed after applying individual filled underfill layers as needed. Chemical or mechanical methods, or combinations thereof, are used to remove the underfill on the bumps and expose the bumps. Such methods include polishing or grinding, dry/wet etching, chemical mechanical polish ("CMP"), reactive ion etching ("RIE"), laser milling, and laser ablation.

FIG. 2B shows the die of FIG. 2A after the outer surface has been planarized to the copper bump by chemical or mechanical polishing. In doing so, underfill has been removed from the outer surface 117 of bump 115. The result is a substantially planar outer surface of the die where the outer surface 117 of bump 115 is exposed.

After the underfill removal step, a layer of unfilled underfill 155 is applied to contact the planarized top of the bumps and the layers of filled underfill on the wafer or package substrate. This unfilled underfill layer may include flux activated material. The flux activated material helps remove oxides on the copper and solder bumps prior to chip join. The final layer of unfilled underfill is preferably not removed from the bump surfaces.

In FIG. 2C, a layer of underfill 155 has been added to cover the planarized surface formed in FIG. 2B, including surface 117 of bump 115 and underfill layers 150. Layer 155 is unfilled underfill, i.e., underfill containing no filler.

Figure 3:
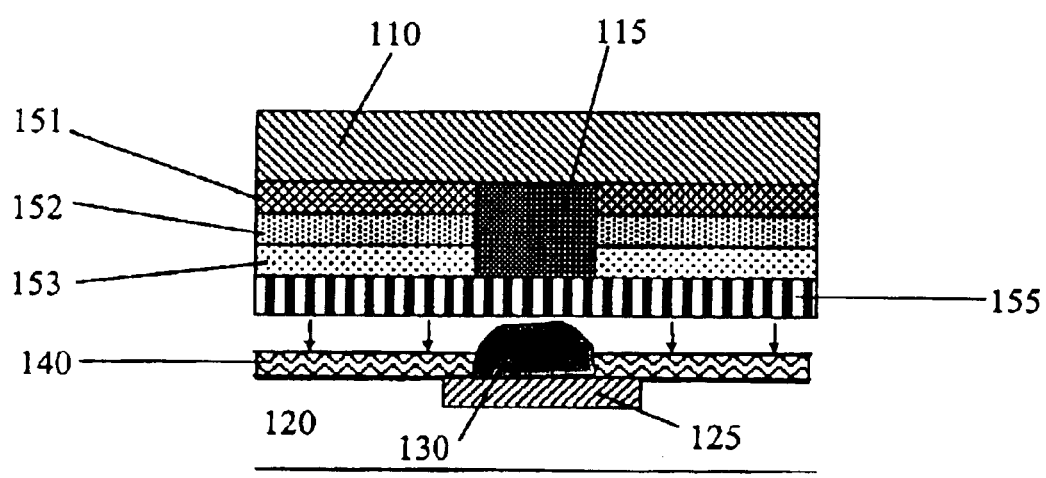
FIG. 3 shows a cross-section of a die with underfill and a matching package substrate in an embodiment of the invention.

FIG. 2C represents one embodiment of a flip chip die just before joinder to a substrate, e.g., a package substrate or PCB. Bump 115 represents one of many bumps on a die. In a given die, each of the bumps present will collectively be treated as shown in FIGS. 2A, 2B, and 2C. Such a die containing a plurality of bumps 115 of FIGS. 2A, 2B, and 2C is preferably one of many dies on a wafer. This allows for manufacturing many packages simultaneously. An individual die or wafer containing many dies, each with a plurality of bumps 115 covered with filled underfill layers 150 and unfilled underfill layer 155, may subsequently be joined to, e.g., a package substrate as shown in FIG. 3.

A chip join process attaches a die to an IC substrate. The IC substrate may be, e.g., a package substrate or PCB. Preferably, thermocompressive bonding effects the flip chip join process at the chip level. Alternatively, a wafer-level join process may be conducted. If so, lamination bonding may be used to join a wafer containing layers of underfill to a sheet or panel package substrate, e.g., a tape package or flex package.

The substrate may include a ceramic, organic, or metal core. The substrate generally contains substrate pads and substrate bumps in locations suitable for electronically mating to corresponding flip chip bumps. The substrate bumps are preferably solder bumps, but other conductive material may be used instead of solder.

Figure 4:
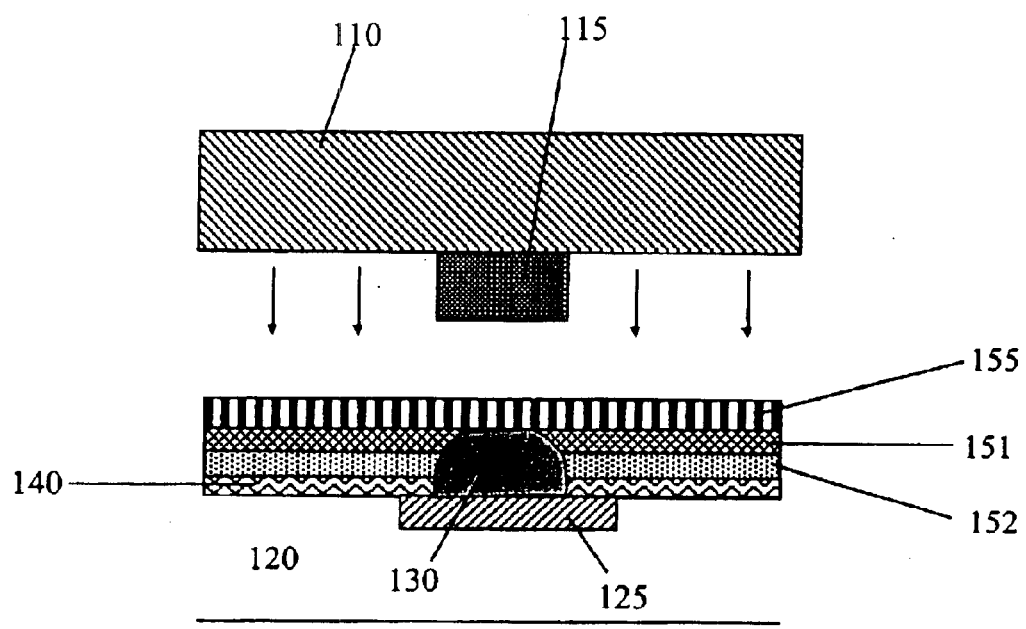
FIG. 4 shows a cross-section of a die and a package substrate, wherein underfill is applied to the package substrate instead of the die in an embodiment of the invention.

In different embodiments of the invention, underfill may be applied in layers to the die 110 (FIG. 3) or the surface of substrate 120 (FIG. 4). In both embodiments, the flip chip bump 115 and substrate bump 130 are joined without either bump passing through an intervening layer of filled underfill.

FIG. 3 shows an embodiment of the invention wherein underfill has been applied to die 110, e.g., by the steps shown in FIGS. 2A, 2B, and 2C. In FIG. 3, die 110 has flip chip bump 115 and filled underfill layers 151, 152, and 153. The filled underfill layers 151, 152, and 153 are each different formulations, e.g., they contain different amounts and/or types of underfill and/or filler.

Matching package substrate 120 contains substrate pad 125, substrate bump 130, and solder resist 140. The arrows in FIG. 3 show the direction of pressure when die 110 and package substrate 120 are joined. Unfilled underfill layer 155 appears above the planarized surface of bump 115 and filled underfill layers 151, 152, and 153. Unfilled underfill layer 155 allows for mating of flip chip bump 115 and substrate bump 130 while eliminating or minimizing intervening filler.

In general, dies have lower CTEs than IC substrate materials. In one embodiment of the invention, successive layers of underfill material create a gradient of CTE increasing in a direction from the underfill layer adjacent to the die to the underfill layer adjacent to the substrate. More preferably, the gradient provides a stepwise and relatively uniform increase in CTE from layer to layer of underfill in a direction from the die to the substrate. Thus, in FIG. 3 where underfill layers are applied to die 110, the CTE of successively added filled underfill layers 151, 152, and 153 increases progressively. To accomplish this, the individual underfill layers are selected to create a gradient of increasing CTE from the die surface outwards towards the package substrate 120. For example, in FIG. 3 the same underfill material and filler is used for layers 151, 152, and 153, but the amount of filler progressively decreases in going from 151 to 153, as represented by the decrease in shading in the respective layers. Accordingly, the CTE increases progressively in each successive layer in the order 151<152<153.

In another embodiment, a flip chip die coated with underfill is directly joined to a PCB. For this embodiment, the IC substrate 120 in FIG. 3 would be a PCB. The die 115 provided with layers of filled underfill 151, 152, and 153 and an unfilled underfill layer 155 as described above, is then joined to PCB 120.

FIG. 4 shows an embodiment wherein underfill has been added to the package substrate 120 instead of to the die 110. Flip chip die 110 and flip chip bump 115 contain no underfill. Instead, underfill layers 151 and 152 appear on package substrate 120. For underfill layers 151 and 152, a gradient may be established with decreasing CTE moving outwardly from substrate 120. This is similarly accomplished by using underfill layers with different CTEs due to differences in formulation, e.g., by varying the amount and/or type of filler.

In contrast to the filled underfill layers in FIG. 3, the CTE of successively added layers in FIG. 4 decreases. In FIG. 4, where underfill is applied to substrate 120, the CTE of successively added underfill layers 152 and 151 decreases progressively from the substrate 120 towards the die 110. This is accomplished in the embodiment of FIG. 4 by first applying layer 152, which contains relatively less filler, then adding layer 151 containing relatively more filler. Layer 152 has higher CTE than layer 151, because both contain the same underfill but layer 151 has relatively more filler. The CTE gradient preferably decreases from the higher CTE component (the substrate) to the lower CTE component (the die) to minimize the detrimental effect of having neighboring components with differing CTE. The result is comparable for FIGS. 3 and 4, in that the CTE of successive filled underfill layers decreases in a direction from the package substrate 120 to the die 110. In FIG. 4, unfilled underfill layer 155 is the final layer above the planarized surface of bump 115 and filled underfill layers 151 and 152. The arrows show the direction of pressure when the two components are joined. As with the embodiment of FIG. 3, unfilled underfill layer 155 in FIG. 4 allows for mating of flip chip bump 115 and substrate bump 130 while eliminating or minimizing intervening filler.

In another embodiment wherein underfill is added to an IC substrate, filled underfill layers and an unfilled underfill layer may be applied to a local area of the PCB instead of to the die. In FIG. 4, the local area of the PCB is illustrated as 120 for this embodiment. A die without underfill may then be joined to that local PCB area. A variety of methods may be used to apply underfill layers to the local area of the PCB, e.g., screen printing or stencil printing. In FIGS. 2A–C, bump 115 would be a bump from a local area of the PCB for this embodiment. As described above, the layers of filled underfill preferably have different filler types and/or amounts to provide a CTE gradient according to the difference in CTE between the die and the PCB.

While embodiments of the invention have been described above, those embodiments illustrate but do not limit the invention. Adaptations and variations of those embodiments are within the scope of the invention as set forth in the following claims.

I claim:

1. A method, comprising:
   providing a die comprising flip chip bumps on a surface thereof;
   applying at least one layer of underfill to the die surface;
   removing excess underfill on surfaces of the bumps to expose the bump surface; and
   applying a layer of unfilled underfill over the filled underfill and exposed bump surfaces.

2. A method as claimed in claim 1, comprising from 3 to 4 filled underfill layers coating the die surface.

3. A method as claimed in claim 1, further comprising the step of joining the die to an IC substrate.

4. A method, comprising:
   providing a die comprising flip chip bumps on a surface thereof;
   applying at least two filled underfill layer to the die surface, wherein each filled underfill layer has a different coefficient of thermal expansion, and the at least two underfill layers provide a gradient of increasing coefficient of thermal expansion from a layer closest to the die surface outwards;
   removing excess underfill on surfaces of the bumps to expose the bump surfaces; and
   applying a layer of unfilled underfill over the filled underfill and exposed bump surfaces.

5. A method as claimed in claim 4, comprising from 3 to 4 filled underfill layers coating the die surface.

6. A method as claimed in claim 4, further comprising the step of joining the die to an IC substrate.

7. A method, comprising:
   providing an IC substrate comprising bumps on a surface thereof;
   applying at least one layer of underfill containing filler to the IC substrate surface;
   removing excess underfill on surfaces of the bumps to expose the bump surfaces; and
   applying a layer of unfilled underfill over the filled underfill and exposed bump surfaces.

8. A method as claimed in claim 7, wherein from 3 to 4 layer of filled underfill are applied to the IC substrate surface.

9. A method as claimed in claim 7, further comprising the step of joining a die to the IC substrate.

10. A method, comprising:
    providing an IC substrate comprising bumps on a surface thereof;
    applying at least two filled underfill layers to the IC substrate surface, wherein each filled underfill layer has a different coefficient of thermal expansion, and the at least two underfill layer provide a gradient of decreasing coefficient of thermal expansion from a layer closest to the die surface outwards;
    removing excess underfill on surfaces of the bumps to expose the bump surfaces; and
    applying a layer of unfilled underfill over the filled underfill and exposed bump surfaces.

11. A method as claimed in claim 10, comprising from 3 to 4 filled underfill layers coating the die surface.

12. A method as claimed in claim 10, further comprising the step of joining a die to the IC substrate surface.

* * * * *